United States Patent [19]

Takizawa et al.

[11] Patent Number: 5,556,800

[45] Date of Patent: Sep. 17, 1996

[54] METHOD OF MANUFACTURING A MASK READ ONLY MEMORY (ROM) FOR STORING MULTI-VALUE DATA

[75] Inventors: Makoto Takizawa; Kazunori Kanebako, both of Yokohama, Japan

[73] Assignee: Kabushiki Kaisha Toshiba, Kawasaki, Japan

[21] Appl. No.: 312,906

[22] Filed: Sep. 30, 1994

Related U.S. Application Data

[62] Division of Ser. No. 42,676, Apr. 5, 1993, Pat. No. 5,386,381.

[30] Foreign Application Priority Data

Apr. 3, 1992 [JP] Japan .................................. 4-81236

[51] Int. Cl.⁶ ...................... H01L 21/266; H01L 21/8246
[52] U.S. Cl. ................. 437/45; 437/29; 437/49; 437/979
[58] Field of Search ............................ 437/45, 979, 985, 437/29, 44, 52, 48, 49

[56] References Cited

U.S. PATENT DOCUMENTS

| | | | |
|---|---|---|---|
| 5,128,738 | 7/1992 | Lee .................................. | 257/390 |
| 5,149,667 | 9/1992 | Choi ................................. | 437/52 |
| 5,192,872 | 3/1993 | Lee .................................. | 257/401 |
| 5,200,355 | 4/1993 | Choi et al. ........................ | 437/52 |
| 5,214,303 | 5/1993 | Aoki ................................ | 365/104 |
| 5,215,934 | 6/1993 | Tzeng ............................... | 437/45 |
| 5,231,299 | 7/1993 | Ning et al. ....................... | 437/45 |
| 5,278,078 | 1/1994 | Kanebako et al. ................. | 437/45 |
| 5,306,657 | 4/1994 | Yang ................................. | 437/29 |

FOREIGN PATENT DOCUMENTS

| | | |
|---|---|---|
| 53-108383 | 9/1978 | Japan ................................. 437/45 |
| 55-70072 | 5/1980 | Japan . |
| 60-57968 | 4/1985 | Japan ................................. 437/979 |
| 62-232956 | 10/1987 | Japan . |

OTHER PUBLICATIONS

Translation of JP 55–70072, Provided in a Previous Office Action.
S. K. Ghandhi, "VLSI Fabrication Principles" 1986; pp. 348–355.

*Primary Examiner*—Tom Thomas
*Assistant Examiner*—Leon Radomsky
*Attorney, Agent, or Firm*—Foley & Lardner

[57] ABSTRACT

A mask ROM for storing multi-value data has a memory cell comprising a primary conductive region formed by a first conductive type semiconductor, a source region formed in the primary conductive region by a second conductive type semiconductor, a drain region formed in the primary conductive region by the second conductive type semiconductor, a channel region adjacently formed with the source region and the drain region, a gate insulation layer formed on the channel region, and a gate electrode formed on the gate insulation layer, wherein the channel region or the gate electrode is divided into a plurality of parts, each divided part having a different layer thickness from the other or a different transmissivity for ion injection, so as to form a ROM.

3 Claims, 12 Drawing Sheets

J"1"

K"00"

METHOD OF MANUFACTURING A MASK READ ONLY MEMORY (ROM) FOR STORING MULTI-VALUE DATA

This application is a division, of application Ser. No. 08/042,676, filed Apr. 5, 1993, now U.S. Pat. No. 5,386,381.

BACKGROUND OF THE INVENTION

The present invention relates to a mask read only memory (ROM), particularly to a mask ROM for storing multi-value data.

A mask ROM configured by NOR-type memory cells stores data in the manner of changing threshold voltages of transistors which are configured in the memory cells. The threshold voltages are controlled by an ion injection onto a gate after forming the gate, a source and a drain which serve as word lines. Since such configured memory cells can store only data "0" and "1", it is necessary to provide a number of memory cell transistors corresponding to a storage capacity of a mask ROM. Here, if one memory cell can store data of more than three kinds, it is possible to greatly increase the storage capacity of a mask ROM. In this specification, such a mask ROM is called as a multi-value ROM. For example, if one memory cell can store four kinds data, it is possible to double the storage capacity in one chip without an increase chip area.

A conventional multi-value ROM stores data as more than three kinds, in the manner that changes of channel width, and length of memory cell transistors causes a current drive capability to be changed. Data are written by using a layer mask in forming a thick oxide isolation. However, since an isolation step is positioned as an initial stage of the manufacturing steps of the mask ROM, there is the problem that there is a long turn-around time (hereunder, called TAT), which is a time period from putting user's data into a manufacturing apparatus to a shipment of a product. Accordingly, the conventional multi-value ROM is not practical because data are written by using a layer mask.

Furthermore there are types of conventional multi-value ROMs which store data by changing threshold voltages of memory cell transistors in the manner that a plurality of ion injection stages are performed by using a plurality of masks of different patterns. However, since this type ROM needs a plurality of openings of photoresist as masks, it has the problem that the TAT is long.

As described above, any type of the conventional multi-value ROM has the problem that the TAT is long.

SUMMARY OF THE INVENTION

An object of the present invention is to provide a multi-value ROM having a short TAT in comparison with the conventional one by writing data in an ion injection step even though a multi-value mask ROM is manufactured.

In order to achieve the above object, a mask ROM according to the present invention includes a memory cell comprising a primary conductive region which is formed by a first conductive type semiconductor, a source region which is formed in the primary conductive region by a second conductive type semiconductor, a drain region which is formed in the primary conductive region by the second conductive type semiconductor, a first channel region which is adjacently formed with the source region and the drain region, a second channel region which is adjacently formed with the source region and the drain region, a gate insulation layer which is formed on the first channel region and the second channel region, a first gate electrode which is formed on the gate insulation layer on the first channel region, and a second gate electrode which is formed on the gate insulation layer on the second channel region and which has a transmissivity higher than the first gate electrode with respect to ion injection. Namely, the gate electrode has the different characteristics of a drain current corresponding to a gate voltage (VG-ID) in the channel regions adjacent to each other.

A mask ROM, by a first aspect of the present invention, has a layer thickness for the second gate electrode which is thinner than the thickness of the first gate electrode.

A mask ROM by a second aspect of the present invention has a gate insulation layer, including a first gate insulation layer, formed on the first channel region and a second gate insulation layer, formed on the second channel region, and has a thickness thinner than that of the first gate insulation layer, the first and second gate electrodes are replaced by a single gate electrode which is successively formed on the first and second gate insulation layers.

In order to manufacture a mask ROM is which multi-value data are stored and which has the above construction, a method of this invention for manufacturing a multi-value mask ROM comprises a step of forming a source region and a drain region in a primary conductive region of a first conductive type semiconductor by a second conductive type semiconductor, a step of forming a gate insulation layer on first and second channel regions which are adjacent to the source and the drain regions, respectively, a step of forming a gate electrode on the gate insulation layer, a step of etching the gate electrode on the second channel region to thin any thickness of the gate electrode thereon, and a step of injecting ions onto the gate electrode by using a mask member in which openings are selectively formed corresponding to written data.

Furthermore, a method of manufacturing a mask ROM according to a third aspect of this invention includes a step of forming a source region and a drain region of a second conductive type semiconductor in the primary conductive region formed by a first conductive type semiconductor, a step of forming a gate insulation layer on a channel region which is adjacent to the source region and the drain region, a step of forming a gate electrode on the gate insulation layer, and a step of injecting ions onto the gate electrode by using a mask member of a thickness which is selectively changed to correspond to the written data.

According to the mask ROM of this invention, the channel region of the memory cell transistor is divided into a plurality of channel regions. Sources and drains of the transmissivities are effectively connected in parallel. Since the transmissivities of the ion injection on the channel regions with respect to the gate electrode are different from each other, the threshold voltages of every channel regions can be different from each other when the data are written by the ion injection. Accordingly, it is possible to connect in parallel the source with the drain of the memory cell transistor, which have the effectively different threshold voltages, respectively. In such a way, it is possible to change a current drive capability of the memory cell transistors, thereby utilizing a multi-value ROM.

Furthermore, it is possible to change depth and dose quantities of an ion injection into the channel region by using as a mask for injecting an ion mask members in which a thickness changes corresponding to data to be written when the data are written into an ordinary memory cell. By this, a current drive capability of the memory cell transistors can be changed to thus obtain the multi-value ROM.

Furthermore, a mask ROM, according to the present invention, has a channel region of memory cell transistors, which is divided into a plurality of channel regions, and has a construction in which a plurality of sources and drains are effectively connected in parallel. Moreover, since gate insulation layers on every channel region have different thicknesses from one another, it is possible to change threshold values even if ion injection conditions are the same for one another. Accordingly, it is possible to utilize multi-value ROM by changing the current drive capability of the memory cell transistors.

In addition to the above construction, writing data into a mask ROM by this invention can be performed in an ion injection step which is adjacent to the final step of a ROM manufacturing process, and an ion injection needs only one mask at writing data into a ROM, thereby obtaining a multi-value ROM having a short TAT in comparison to the conventional methods.

As described above, the use of the present invention can shorten the TAT.

DETAILED DESCRIPTION OF THE PREFERRED EMBODIMENT

There will now be described in detail preferred embodiments of a mask ROM for storing multi-value data according to the present invention, with reference to the accompanying drawings.

A first embodiment of this invention is described by using FIGS. 1 to 8.

Figure 1:
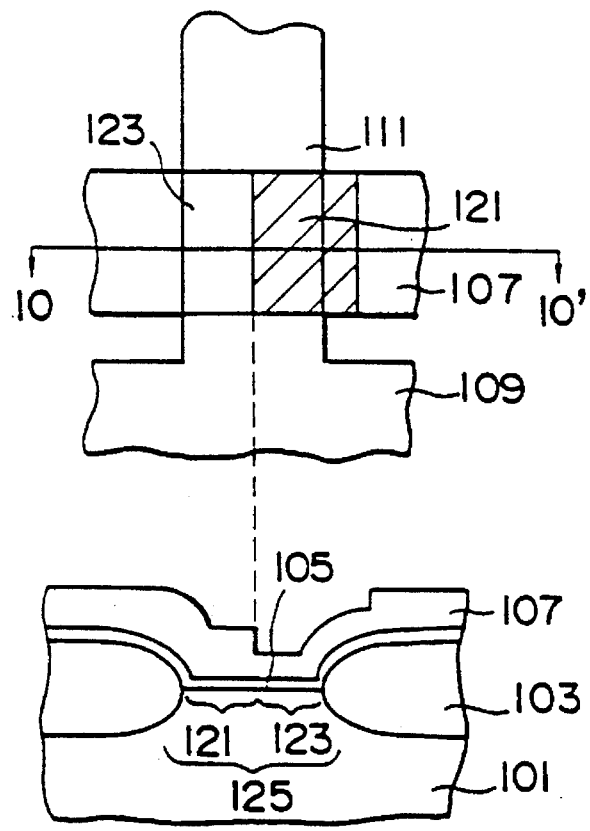
FIG. 1 is a plan view including a sectional view corresponding thereto, showing a mask ROM according to a first embodiment of the present invention.

FIG. 1 shows a memory cell transistor having a channel 125 which is divided into a first channel 121 and a second channel 123. A field insulation layer 103 is formed in an element separation region of a P-type silicon substrate 101, and a gate oxide layer 105 is formed on the channel region 125. A source region 109 and a drain region 111 are formed by diffusing an n-type impurity. The source region is connected to a ground potential through a diffusion layer, and the drain region is connected to a bit line through a contact hole. A poly-silicon gate 107 as a word line is formed in the manner of having a heavy thickness on the first channel region and a thin thickness on the second channel region. The poly-silicon gate 107, which includes the second channel region and is shown by slant line in FIG. 1, is removed by etching a predetermined depth by means of a photoresist as a mask.

Figure 2:
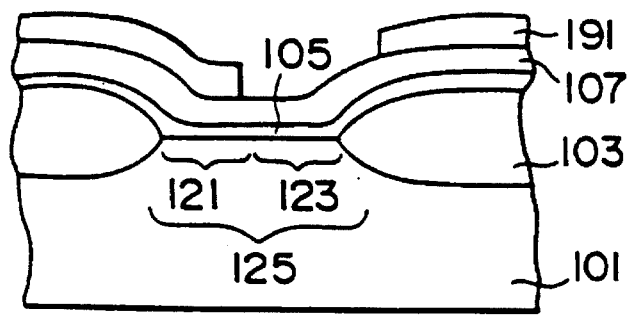
FIG. 2 is a sectional view showing the mask ROM according to the first embodiment of the present invention.
Figure 3:
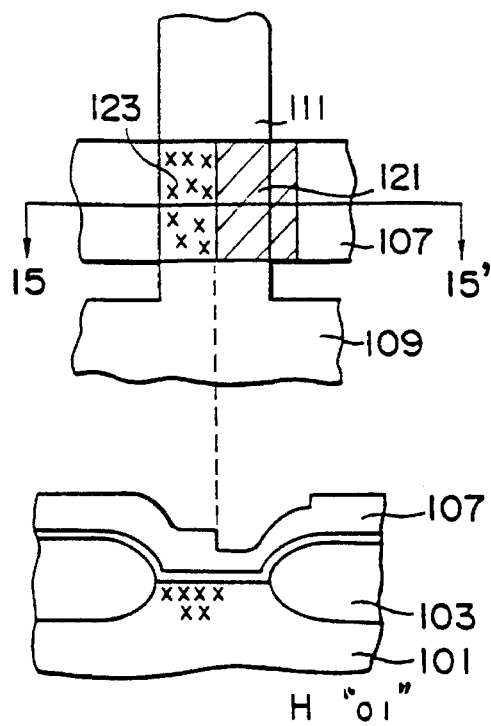
FIGS. 3 to 6 are plan views including sectional views corresponding thereto, each showing the mask ROM according to the first embodiment of the present invention.
Figure 4:
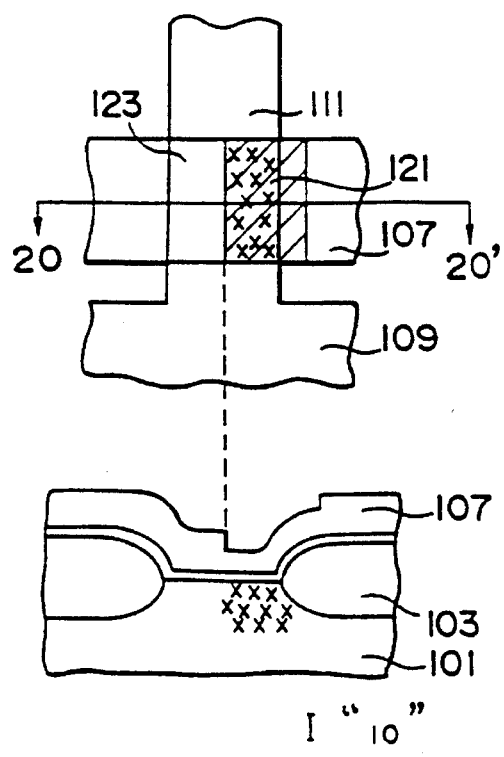
Figure 5:
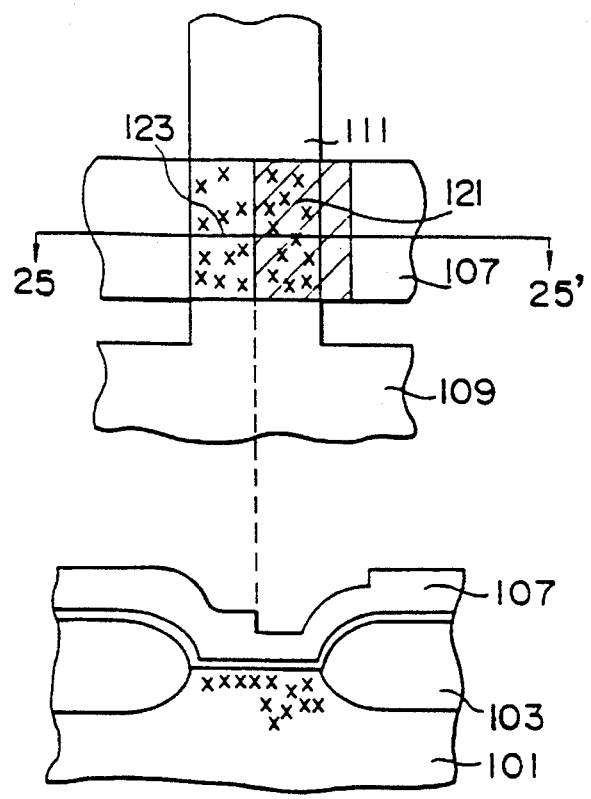
Figure 6:
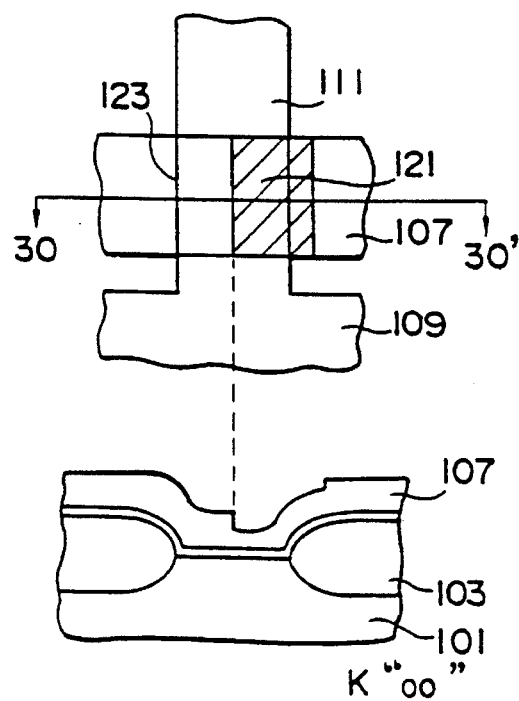

Furthermore, as shown in FIG. 2, in order to form a gate having steps, a gate electrode may be formed by a double layer structure including the poly-silicon gate 107 and an oxide layer 191, and only the oxide layer on the second channel region 123 may be removed by etching. The precision in processes of the latter structure is better than that of the former structure because the poly-silicon gate 107 functions as an etching stopper at etching the oxide layer 123.

Data writing is performed, as shown by H, I, J and K in FIGS. 3–6, by an ion injection according to the data. An X region is an ion injection region, and the ion injection uses a photoresist as a mask. Since the gate layer on the second channel region 123 is thinner than the gate layer on the first channel 121, a threshold voltage is enlarged by the deep reaching of ions when ions such as boron are injected at the same energy. The ion injecting energy and dose quantity are controlled in the manner that the threshold voltages have a difference between the first channel 121 and the second channel 123.

In this invention, ion injection can be performed in a plurality of times and in the different condition by using the same mask. Controllability of the threshold voltages increases in this process. In comparison with the conventional example, since this invention needs only one mask, even though two kinds of ion injection are performed, the TAT becomes shorter.

For example, in the memory cells having the construction shown in FIG. 2, the gate oxide layer 105 is formed of about 16 nm, the poly-silicon gate 107 having 400 nm, and the oxide layer 191 having 300 nm. There is an ion injection condition in which the ion is boron, in which a first dose quantity is $10^{14}$ cm$^{-2}$ by 170 keV, and a second dose quantity is $10^{13}$ cm$^{-2}$ by 270 keV. By this, the threshold voltage is 1 V when ion injection is not performed, and the threshold voltage of the first channel 121 is 3 V and the threshold voltage of the second channel 123 is 5 V when ion injection is performed.

In such a manner, the memory cells writing the data function as a circuit in which the source and drain having the different voltages of the transistor are connected in parallel. When the data are written in such a manner of an H, the memory corresponds to a circuit in which transistors each having the threshold voltages of 1 V and 3 V are connected in parallel. A character I corresponds to a circuit in which transistors each having threshold voltages of 1 V and 5 V are connected in parallel. A character J corresponds to a circuit in which transistors each having threshold voltages of 3 V and 5 V are connected in parallel each other. A character K corresponds to a circuit in which two transistors each having threshold value 1 V are connected in parallel each other. In such a manner, four types of transistors, having different current drive capabilities, can be effectively formed.

Figure 7:
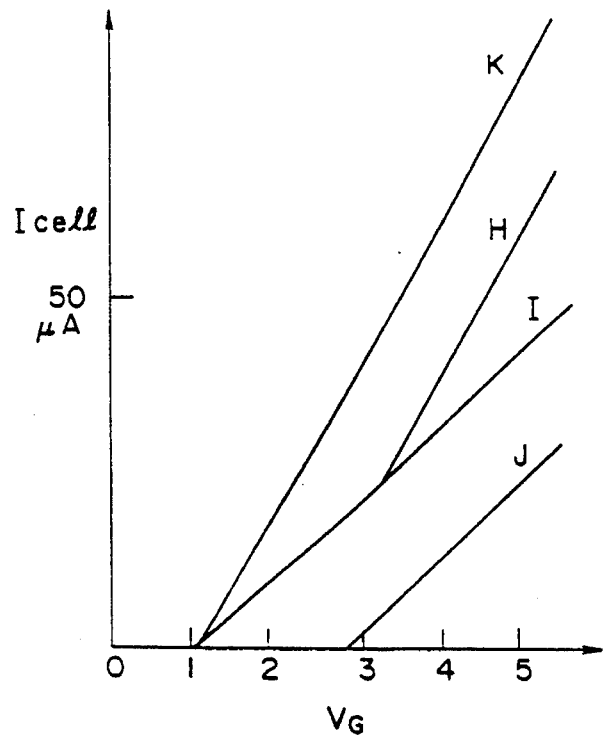
FIG. 7 is a view showing current and voltage characteristics of the mask ROM according to the first embodiment of the present invention.

There is shown in FIG. 7 an example of a relationship at this time between a gate voltage Vg and a cell current $I_{cell}$ when the voltage of 1 V is supplied between the source and drain. In such a manner, a flowing voltage has an order of the magnitude of K, H, I, and J when the voltage of 5 V is supplied to the gate. Data correspond to "00", "01", "10" and "11". For example, in the case shown in FIG. 7, the cell current is in the order of 80μA, 60μA, 40μA, and 20μA. In this manner, it is possible to store four data in one memory cell.

Figure 8:
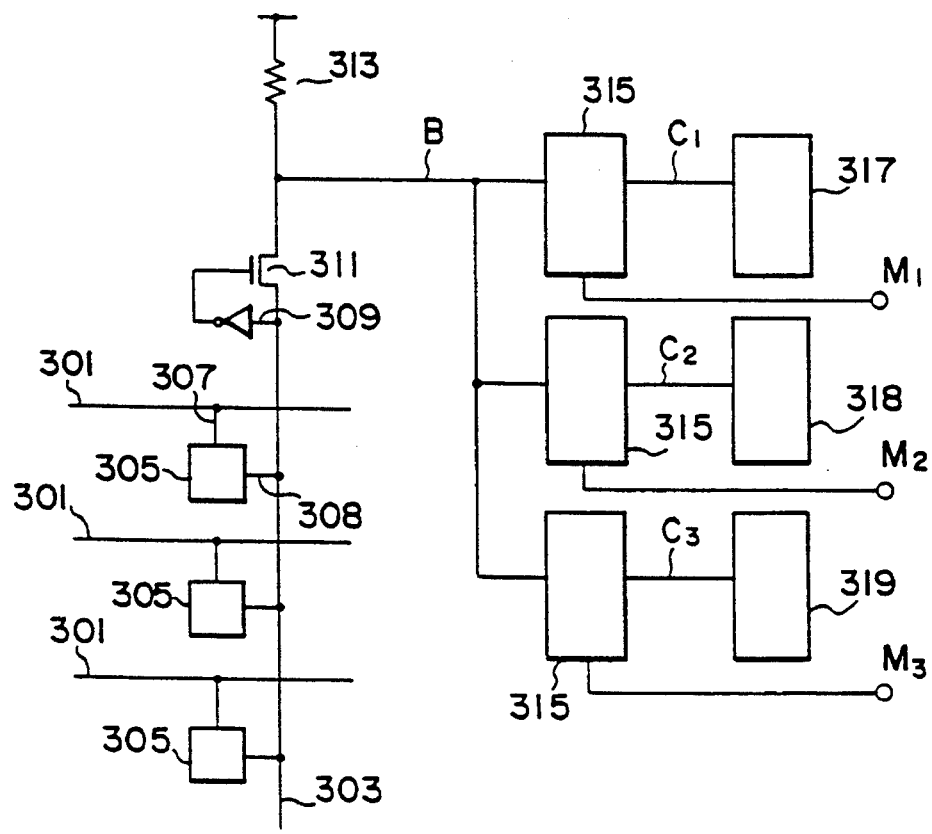
FIG. 8 is a circuit diagram showing the mask ROM according to the first embodiment of the present invention.

There is shown in FIG. 8 a read-out circuit which is connected to bit lines. A negative feedback amplifier including a metal oxide semiconductor (MOS) transistor 311, an invertor 309 and a resistor 313, is connected to a bit line 301 which is included in a cell array further including a word line 301 and a memory cell 305 in addition to the bit line 301. By this construction, a voltage of a node B changes in dependence with data written in the memory cell. When the voltage of the node B reading out the data is $V_{00}$, $V_{01}$, $V_{10}$ and $V_{11}$, each voltage has a relationship as follows;

$$V_{00} < V_{01} < V_{10} < V_{11}$$

Output voltages of reference voltage generation circuits 317, 318 and 319 are set to $C_1$, $C_2$ and $C_3$. A comparator 315 configured by a current mirror circuit outputs a high level to an $M_i$ (i=1–3) when $B > C_i$ (i=1–3), and outputs a low level to the $M_i$ (i=1–3) when there is not the above condition. Here, when $C_i$ (i=1–3) is set in the manner of satisfying conditions $V_{00} < C_1$
$C_1 < V_{01} < C_2$
$C_2 < V_{10} < C_3$
$C_3 < V_{11}$, the output of the $M_i$ (i=1–3) is determined corresponding to the data "00", "01", "10" and "11". Encoding this output makes data simply set to 2 bits.

As above-described with respect to the first embodiment, if the channel of the memory cell transistor is divided into two parts to change thickness of gates, it is possible to write four information corresponding to data "00", "01", "10" and "11" into one memory cell, thereby utilizing a multi-value ROM. Furthermore, since a data storage in ROM can be performed in an ion injection step which is adjacent to the final step of manufacturing, one mask may be used for storing data, thereby obtaining a multi-value ROM having a short TAT in comparison with a conventional multi-value ROM.

Even through, in the above embodiments, the channel of the memory cell transistor is divided into two parts, the present invention is not limited in this construction, and the channel may be divided into three parts. However, if more than three parts, it is necessary to change thickness of the gate electrode in a number which same as is the number of divided parts.

Furthermore, the channel may be divided into two parts each having a different width of the predetermined rate in order to change a current drive capability of the memory cell corresponding to each stored data. This is the same as more than three parts.

Next, there will be a second embodiment applying the present invention with a virtual ground NOR type memory cell with reference to FIGS. 9–13.

The virtual ground NOR type memory is one the NOR type mask ROMs (for example, see SHARP ELECTRIC COMPANY technical report pp 71–75, No. 40, 1988). A memory cell of this type is configured in the manner that a memory cell portion has no element separation by means of a selectional oxidation method, and there is a non-contact construction in the memory cell array.

Figure 9:
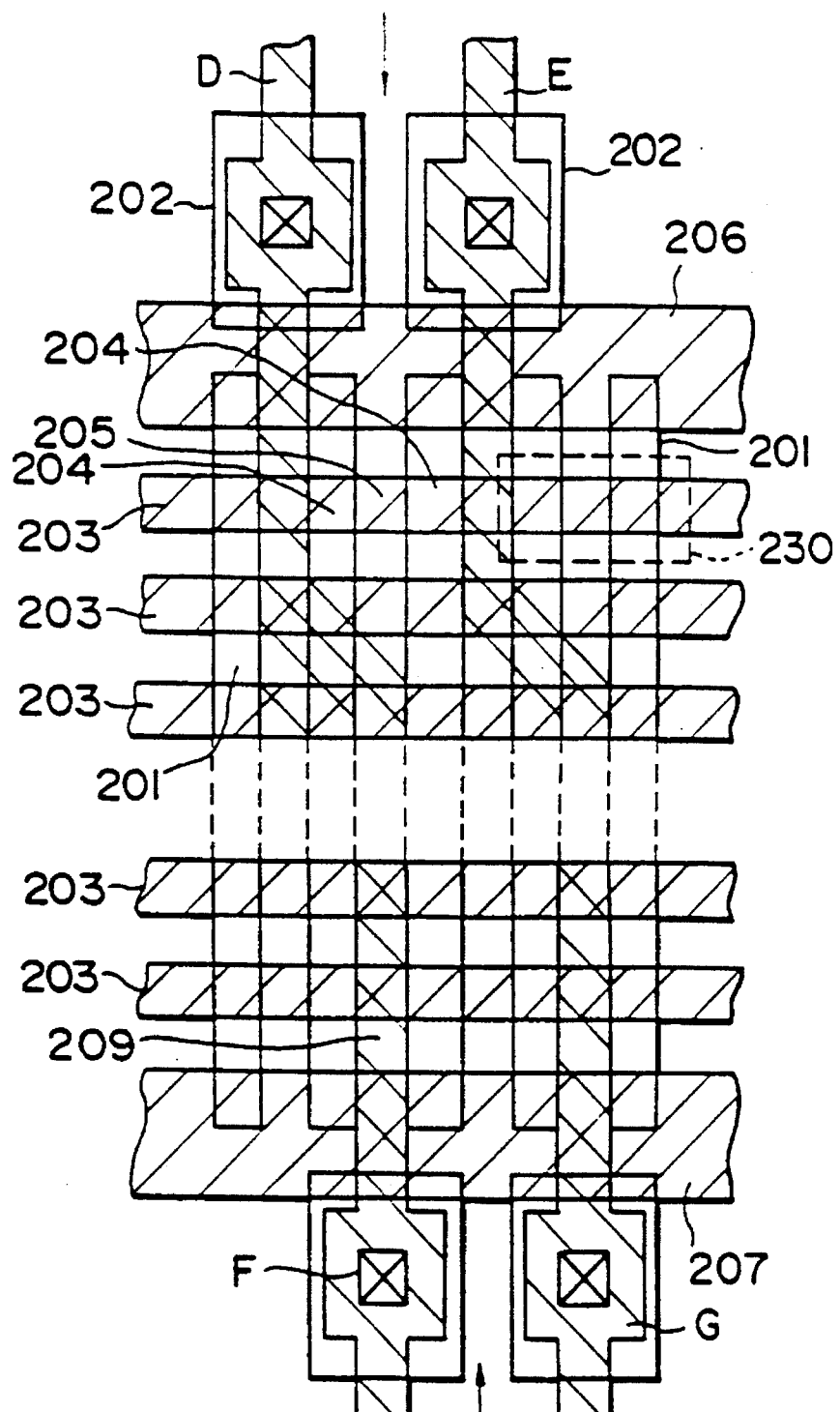
FIGS. 9 and 10 are a plan view and a circuit diagram, respectively, each showing a virtual ground and NOR type memory.

As shown in FIG. 9, an N type diffusion region 201 having a parallel stripe shape is formed on a P type semiconductor substrate, and a word line 203 of polysilicon is provided in parallel at right angle of the stripe of the diffusion region 201. A source/drain region 204 is formed on the intersection of the N type diffusion region 201 and the word line 203, and a channel 205 is formed immediately under the word line 203 between the source/drain region 204. A metal wiring 209 is formed on the channel 205. In this manner, it is possible to utilize a memory cell array having flat cells without an element separation region.

Figure 10:
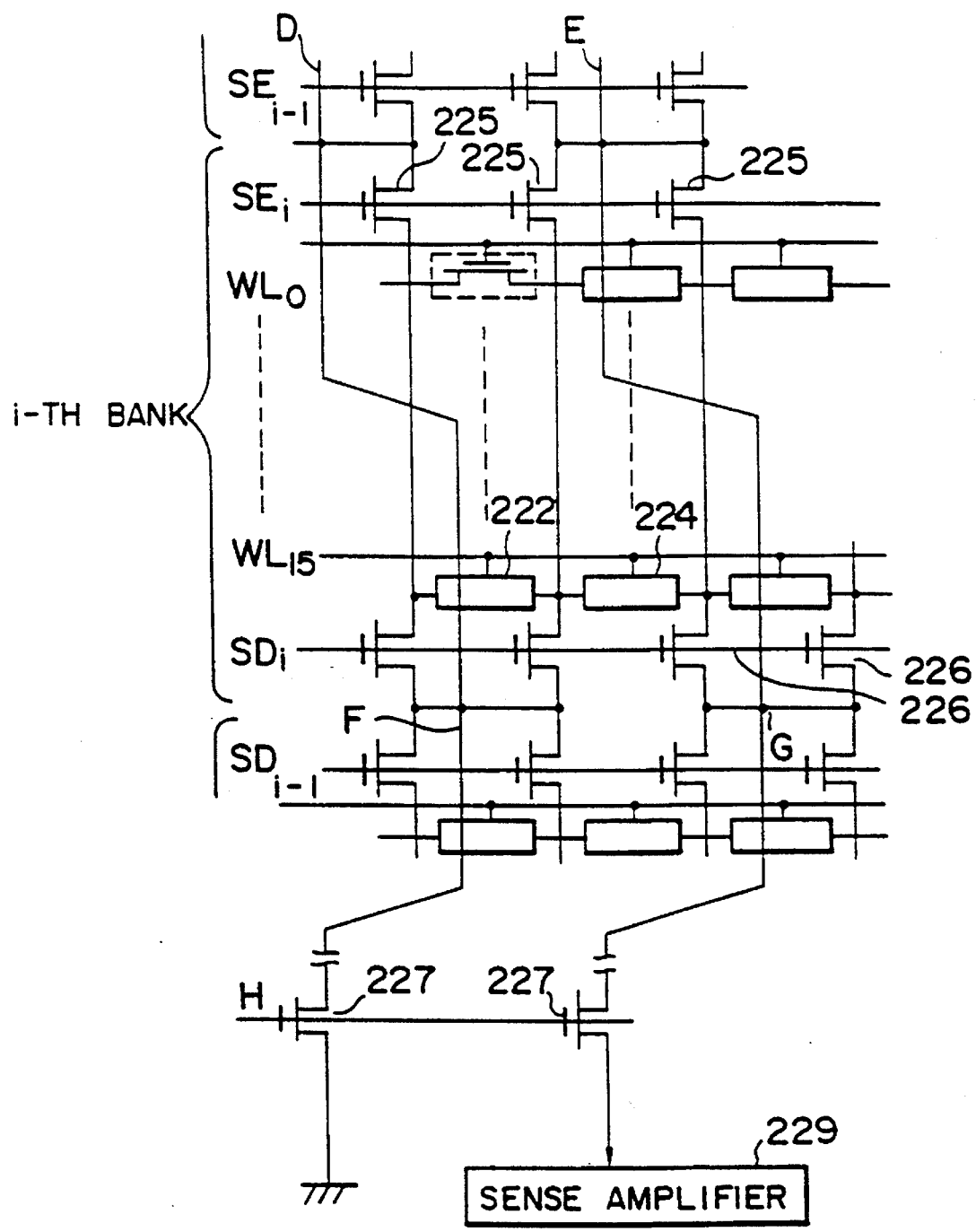

FIG. 10 shows a part of a ROM circuitry using the above memory cell array. Since such a flat cell construction uses an N type diffusion layer as a part of the bit line and ground line, the contact capacity and resistance of these lines become larger. The mask ROM has a bank selection structure in which a memory cell array is divided into a plurality of banks in order to shorten a transmission delay time of the bit lines. FIG. 10 mainly shows an i-th bank. Each bank comprises two kinds of bank selection transistors which are connected to both of the bit lines and the ground line. One is a transistor 225 for selecting even lines, the other is a transistor 226 for selecting odd lines. Characters D, E, F and G in FIG. 9 correspond to those in FIG. 10.

For example, when memory cells 222, in the even lines, are accessed, a row selection transistor 227 is turned on after WL15 and SEi become active, then H becomes active. As a result, the data in the memory cells are supplied to sense amplifier 229. In the case where memory cells 224 in odd lines are accessed, WL15 and SOi are active, and then H becomes active.

Figure 11:
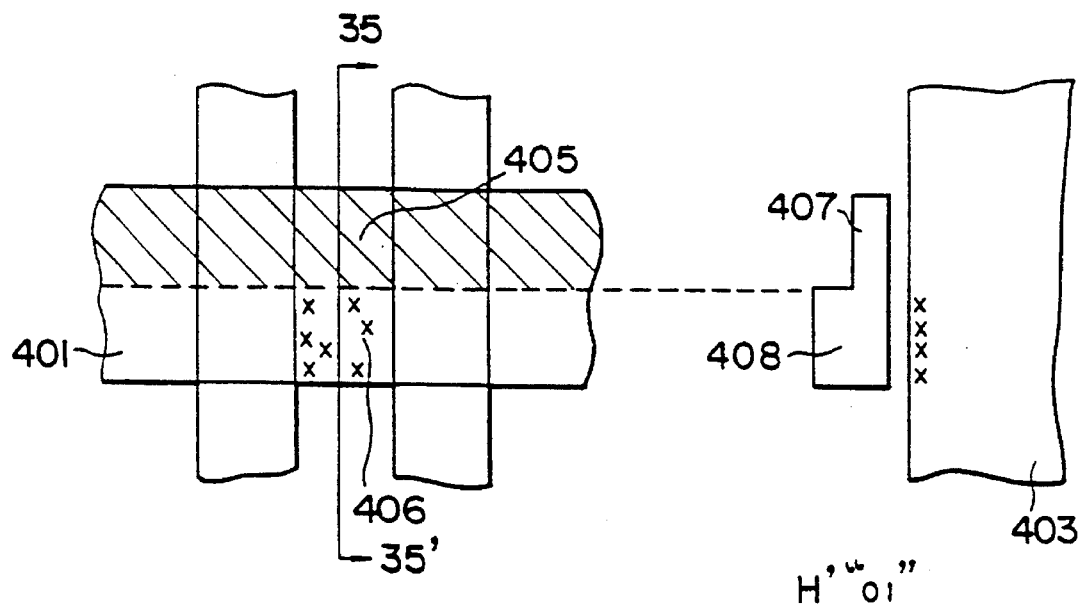
FIGS. 11 to 14 are plan views including sectional views corresponding thereto, each showing a mask ROM according to a second embodiment of the present invention.
Figure 12:
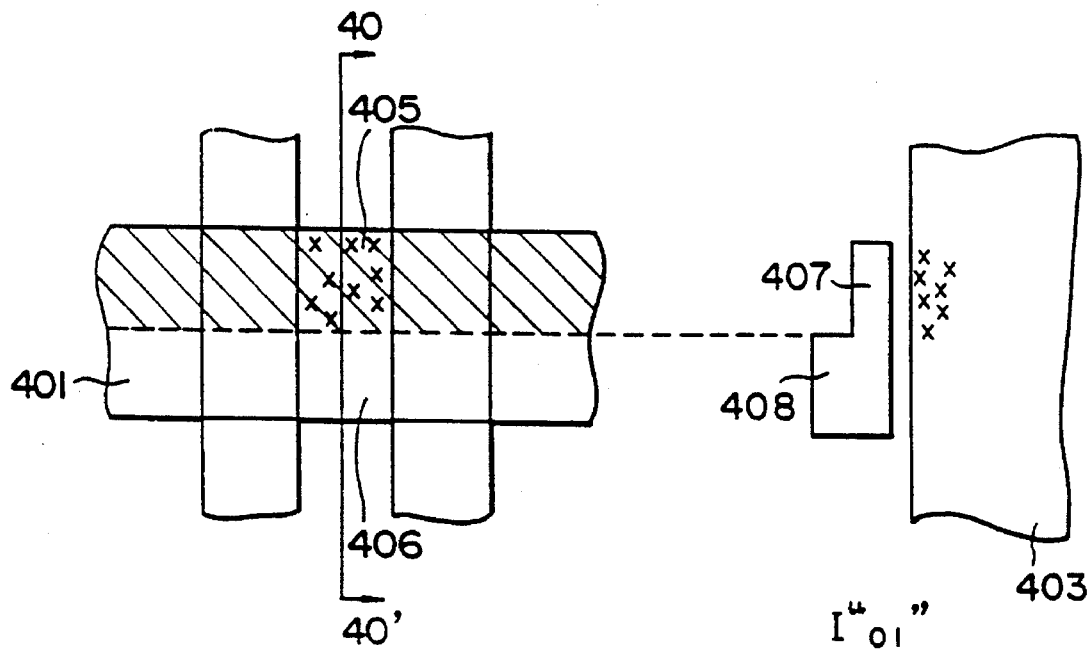
Figure 13:
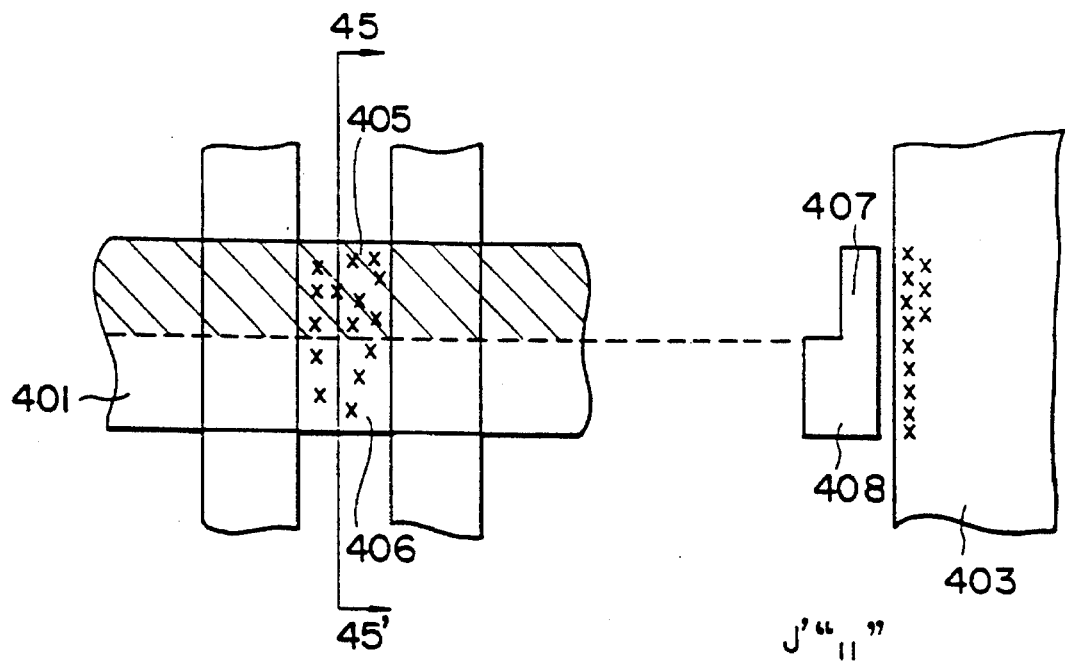
Figure 14:
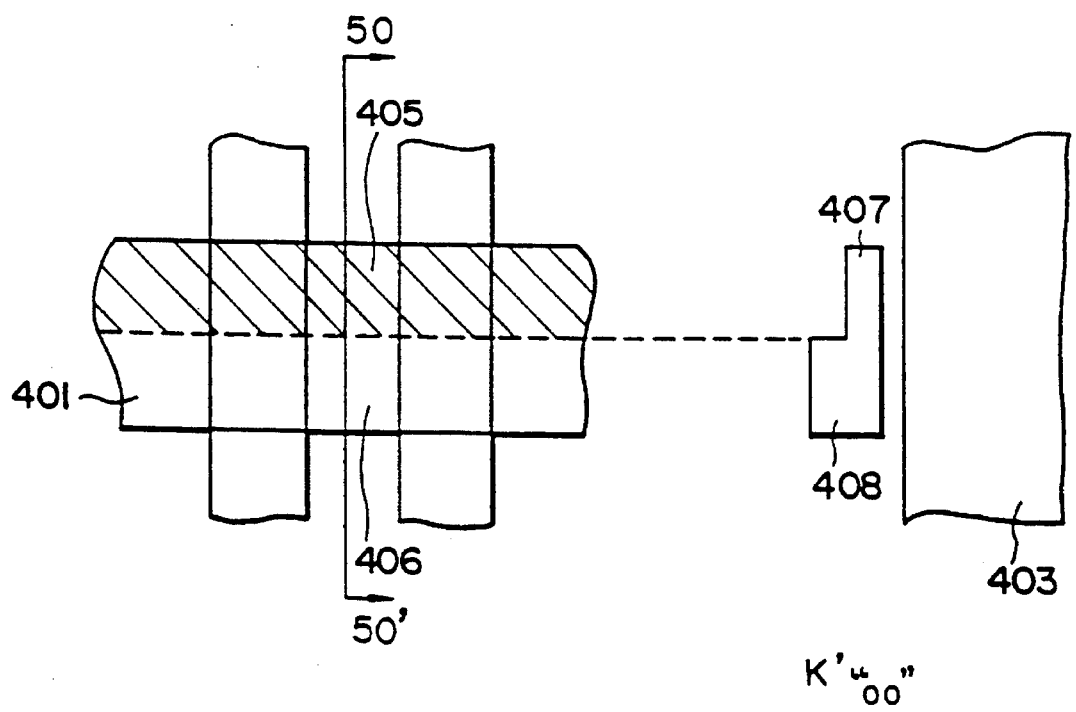

FIG. 11 is an expansion view of a dotted-line portion 230 of FIG. 9. A source/drain region 402 is formed by providing an N type diffusion region having stripe shape on a P type semiconductor substrate 403. A word line 401 of polysilicon is formed in the manner of sandwiching in a thin insulation layer which is formed on the semiconductor substrate. After a channel under the word line 401 is divided into two parts, a word line 407 on a second channel 405 is etched by using a mask of a photoresist to have a layer thickness thinner than that of a word line 408 on a first channel. Of course, only polysilicon may be etched by using a two layer structure of poly-silicon and oxide layers in the same manner as the first embodiment. The latter case has higher precision than that of the former case.

Data are written by injecting ions as shown by H', I', J' and K' in FIGS. 11–14. An X region is an ion injection region. An ion injection is performed by using a photoresist as a mask. Of course, the same mask is used twice to perform an ion injection in the same manner as the first embodiment. Since a thickness of the gate oxide layer on the second channel 405 is thinner than that on the first channel 406, threshold voltages largely change when an ion is injected by the same energy. An injection energy, and dose quantity are controlled in the manner that there is a difference between the threshold voltages of the first channel 406 and the second channel 405. For example, the control is performed when a threshold voltage is 1 V when an ion is not injected, and a threshold voltage of the first channel 406 is 3 V and a threshold voltage of the second channel 405 is 5 V when an ion is injected. As in the first embodiment, when a bit line voltage of about 1 V is supplied to the drain and 5 V is supplied to the gate, flowing currents are large in the order of K', H', I' and J', and data correspond to "00", "01", "10" and "11". A sense amplifier of the second embodiment is the same as the first embodiment.

In the second embodiment, when the thickness of the gate changes by dividing the channel of the memory cell transistor into two parts as the same as the first embodiment, one memory cell can store four information corresponding to the data "00", "01", "10" and "11". Namely, it is possible to utilize a multi-value ROM of a virtual ground NOR type. By the second embodiment, since data can be written in an ion injection step which is adjacent to the final manufacturing step, only one mask is necessary to write data, thereby obtaining a multi-value ROM having a TAT shorter than the conventional ROM.

Furthermore, the word lines are formed by the smallest pitch on the manufacturing process in the second embodiment. Accordingly, it is possible to perform etching of the word lines in the manner that the photoresist is also formed by the smallest pitch and half pitch is displaced. Namely, when the word lines are divided into two parts, the storage capacity can be doubled even though the smallest pitch does not change.

Next, there is described a third embodiment changing a thickness of a gate insulation layer with reference to FIGS. 15–18.

Figure 15:
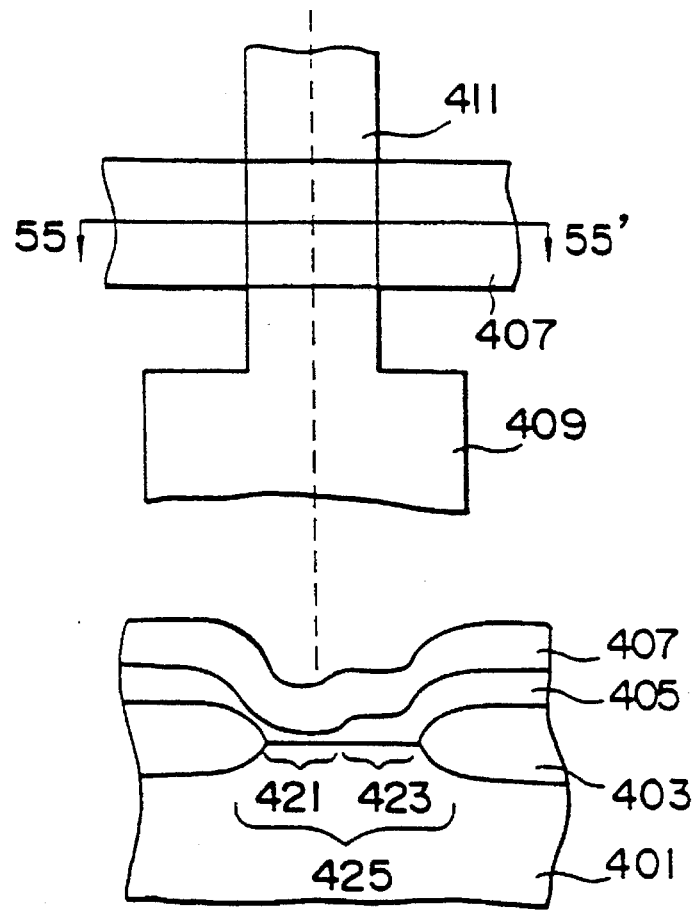
FIG. 15 is a plan view including a sectional view corresponding thereto, showing a mask ROM according to a third embodiment of the present invention.

FIG. 15 shows a memory cell transistor in which a channel 425 is divided into two parts of a first channel 421 and a second channel 423. A field insulation layer 403 is formed in an element separation region of a P type silicon substrate 401, and a gate oxide layer 405 is formed on the channel region 425. Here, the gate oxide layer 405 on the first channel 421 is formed thinner, while the layer 405 on the second channel 423 is thicker. A formation method is such that the gate oxide layer 405 on the first channel is cut to a predetermined depth by selective etching. A source region 409 and drain region 411 are formed by diffusing an N type impurity. The source region is connected to a ground potential through a diffusion layer, and the drain region is connected to the bit lines through contact holes. The polysilicon gates 407 function as word lines.

Figure 16:
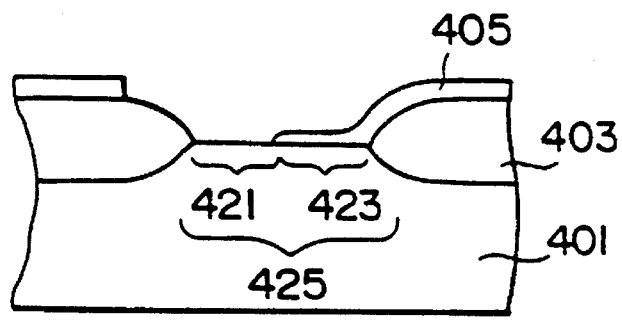
FIGS. 16 and 17 are sectional views each showing the mask ROM according to the third embodiment of the present invention.
Figure 17:
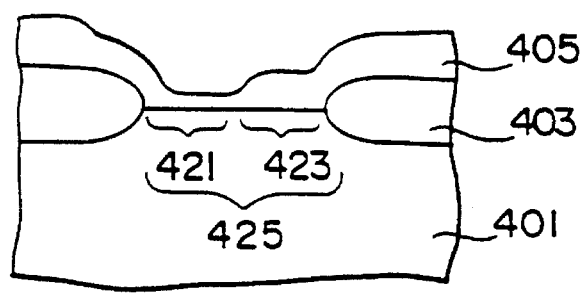

In the third embodiment, the gate oxide layer is also formed in two steps for making a gate oxide layer having a stepped portion. As shown in FIG. 16, a predetermined thickness of the gate oxide layer 405 is first formed by heat treatment, 1 and then the gate oxide layer on the first channel 421 is selectively removed. Then, as shown in FIG. 17, the gate oxide layer 405 is further grown by a heat treatment. In such a manner, the gate oxide layer having a step portion is formed. This forming method has higher precision than former method.

Data are written by an ion injection according to data, in the same manner as shown by H, I, J and K in FIGS. 3–6 explaining the first embodiment. An X region is an ion injection region. An ion injection is performed by using a photoresist as a mask. Since a thickness of the gate oxide layer on the first channel 421 is thinner than that on the second channel 423, a threshold voltage changes when an ion such as boron is injected by the same energy. An injection energy and dose quantity are controlled in the manner that there is a difference between threshold voltages of the first channel 421 and the second channel 423.

For example, when the gate oxide layer on the first channel 421 has a thickness of 16 nm, and the second channel of 34 nm, four kinds transistors having different current drive capability are effectively formed in an ion injecting condition which is the same as the first embodiment.

Figure 18:
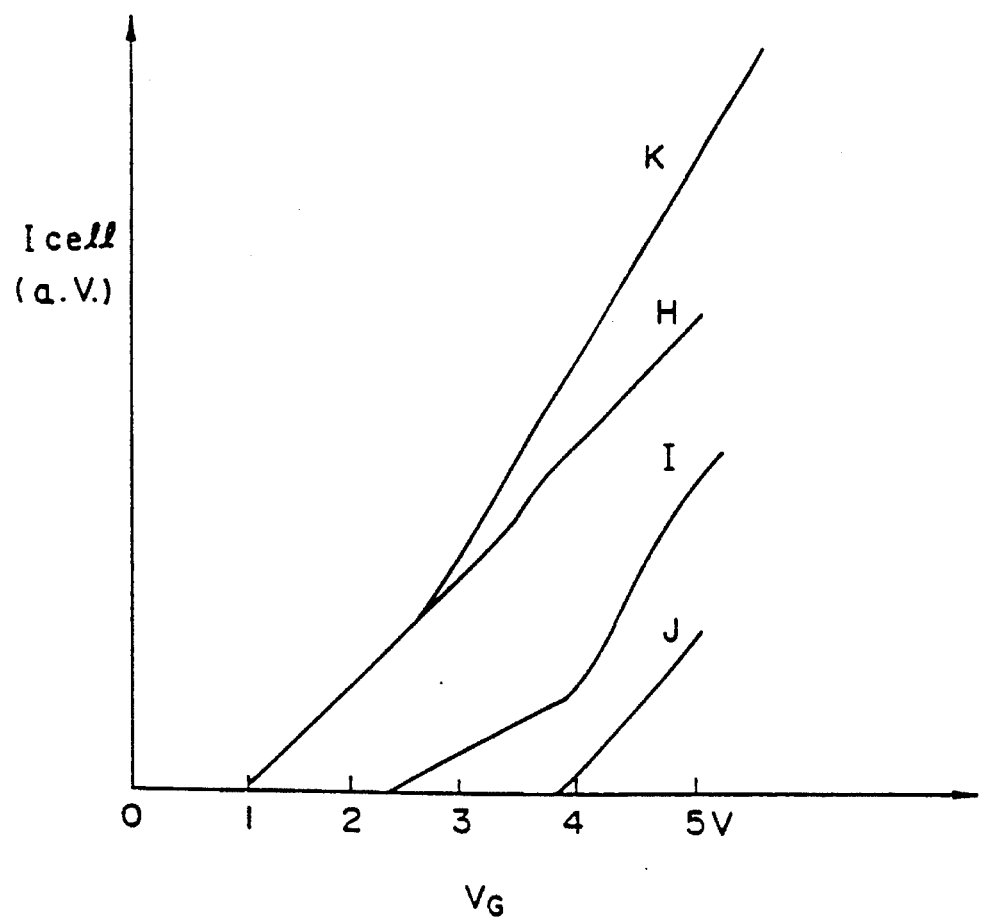
FIG. 18 is a view showing current and voltage characteristics of the mask ROM according to the third embodiment of the present invention.

Here, FIG. 18 shows the relationship between a gate voltage $V_g$ and a cell current $I_{cell}$ when a voltage of 1 V is supplied between the source and drain. In this manner, when the voltage of 5 V is supplied to the gate, flowing currents are in the large order of K, H, i and j, and data correspond to "00", "01", "10" and "11". Peripheral circuits of the memory cell array are the same in the first embodiment.

In the second embodiment, when the thickness of the gate changes by dividing the channel of the memory cell transistor into two parts, the same as in the first embodiment, one memory cell can store four information data corresponding to the data "00", "01", "10" and "11". Namely, it is possible to utilize a multi-value ROM of a virtual ground NOR type. By the second embodiment, since data can be written in an ion injection step which is adjacent to the final manufacturing step, only one mask is necessary to write data, thereby obtaining a multi-value ROM having a TAT shorter than the conventional ROM.

Next, there is described a fourth embodiment, changing the thickness of a mask member corresponding to writing data and injecting an ion with reference to FIGS. 19–22.

Figure 19:
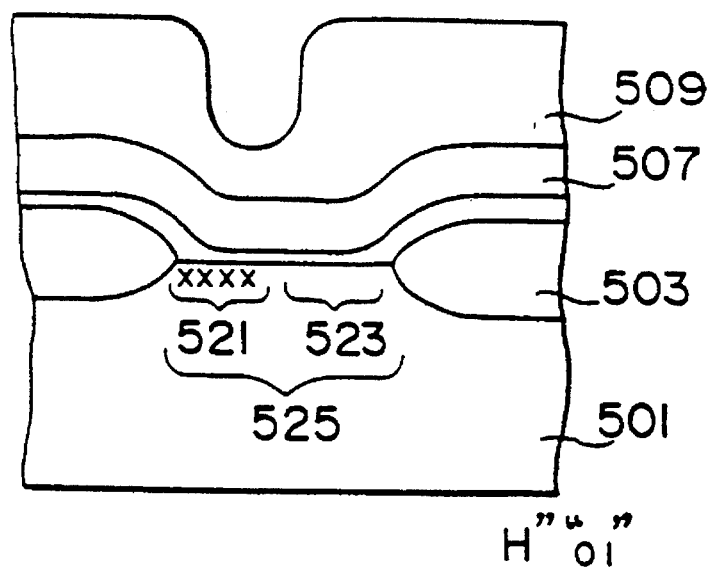
FIGS. 19 through 22 are sectional views each showing a mask ROM according to a fourth embodiment of the present invention.
Figure 20:
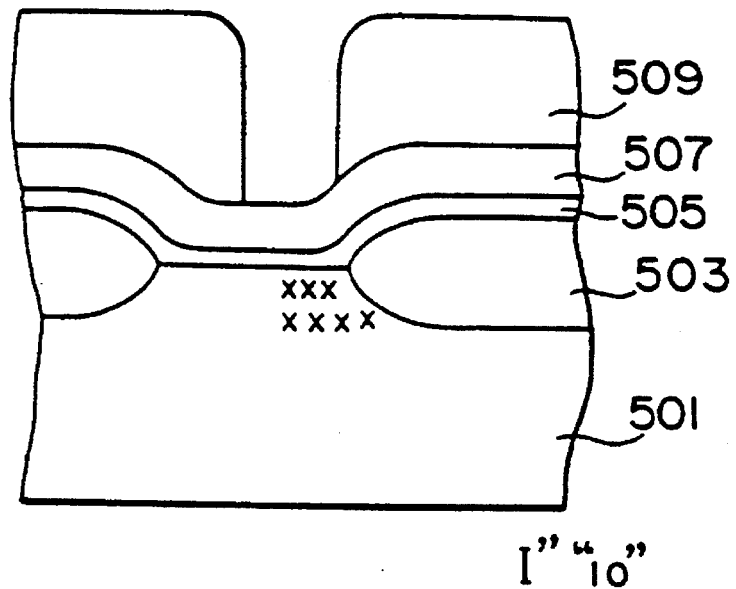
Figure 21:
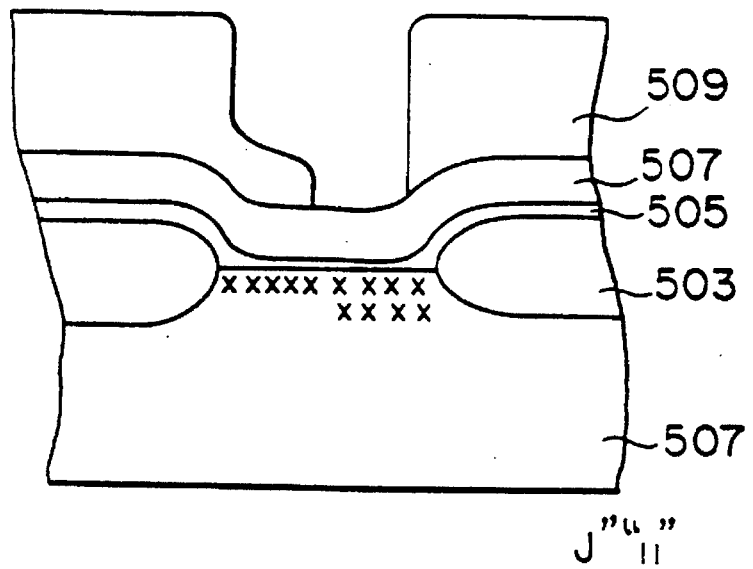
Figure 22:
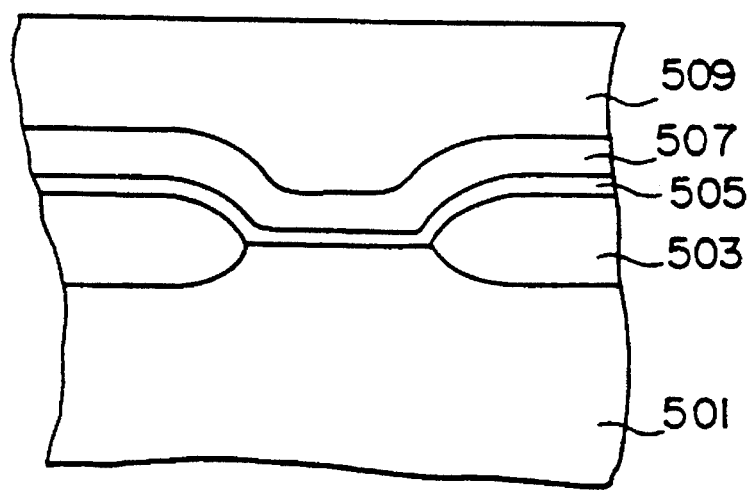

FIG. 19 shows a memory cell transistor in which a channel 525 is divided into two parts of a first channel 521 and a second channel 523. A field insulation layer 503 is formed in an element separation region of a P type silicon substrate 501, and a gate oxide layer 505 is formed on the channel region 525. Even through there is not shown in the figure, a source region and a drain region are formed by diffusing an N type impurity. The source region is connected to a ground potential through a diffusion layer, and the drain region is connected to the bit lines through contact holes. The polysilicon gates 507 function as word lines. On the poly-silicon gate, there is formed a photoresist 509 thickness of which is changed corresponding to data to be written. The resist pattern is formed in that, when a hole is open on the first channel 521, a portion corresponding to the hole remains as a thin layer. Namely, there are three ways in which a thick resist is formed, a resist remains as a thin film, or a resist is completely removed, thereby resulting four cases H", I", J" and K" as a combination shown in FIGS. 19–22.

In order to leave a thin resist, a ROM mask is formed in two kinds patterns of light and shade, and the patterns are developed by changing the irradiation amount of ultraviolet rays.

Data are written by an ion injection according to data, in the manner as shown by H", I", J" and K" in FIGS. 19–22. An X region is an ion injection region. An ion injection is performed by using a photoresist as a mask. Of course, ions may be injected twice by using the same mask in the same manner as the first embodiment. Since a thickness of the gate oxide layer on the second channel 523 is thicker than that on the first channel 521, a threshold voltage changes because an injected ions are shallow when injected by the same energy. An injection energy and dose quantity are controlled in the manner that there is a difference between threshold voltages of the first channel 521 and the second channel 523. For example, the control is performed in that a threshold voltage is 1 V when an ion is not injected, and a threshold voltage of the first channel 521 is 3 V and a threshold voltage of the second channel 523 is 5 V when an ion is injected. As being the same as the first embodiment, when a bit line voltage of about 1 V is supplied to the drain and 5 V is supplied to the gate, flowing currents are large order of K", H", I" and J" and data correspond to "00", "01", "10" and "11". A sense amplifier for writing data of the fourth embodiment is the same as the first embodiment.

In the fourth embodiment as described above, when the thickness of the gate changes by dividing the channel of the memory cell transistor into two parts as the same as the first embodiment, one memory cell can store four information data corresponding to the data "00", "01", and "11". Since data can be written in an ion injection step which is adjacent to the final manufacturing step, only one mask is necessary to write data, thereby obtaining a multi-value ROM having a TAT shorter than the conventional ROM.

The above described third and fourth embodiments may be used in the virtual ground NOR type memory cell and obtain the same effect in the same manner as the second embodiment.

Even though all of the first through fourth embodiments obtain the N type MOS transistor formed on the P type silicon substrate and control the threshold voltage by injecting a boron ion, a P type MOS transistor may be formed on an N type silicon substrate and may be controlled by injecting phosphorus and arsenic ions.

Furthermore, even through all of the first through fourth embodiments use the threshold voltage of 3 V and 5 V when a ion is injected, the present invention is not limited to such a voltage, and a certain range of the voltage difference may be kept.

Moreover, even though the first through fourth embodiments use poly-silicon to the word lines, when word lines may be a formed by a polyacid of metal such as polytangstic acid, polymolybdic acid and the like, there will be obtained the same effect as the use of polysilicon.

What is claimed is:

1. A method of manufacturing a multi-value mask read-only memory (ROM), comprising the steps of:

forming a second conductivity type source and drain regions in a first conductivity type primary conductive region;

forming a gate insulation layer on a channel region of said primary semiconductor region adjacent to the source and the drain regions;

forming a gate electrode on said gate insulation layer;

etching said gate electrode such that thickness of a first portion of said gate electrode is reduced compared to thickness of a second portion of said gate electrode;

a step of implanting ions through said gate electrode forming a mask member containing openings which are selectively formed corresponding to the data to be written; and performing a data writing step comprising implanting first energy ions through said gate electrode using said mask member to form a first channel subregion under the first portion of said gate electrode and a second channel subregion under the second portion of said gate electrode, wherein the concentration and depth of the implanted ions is greater in said first channel subregion than in said second channel subregion.

2. The method of manufacturing a mask ROM according to claim 1, wherein the concentration and depth of the implanted ions in said first and second channel subregions give said mask ROM a multi-value condition.

3. The method of manufacturing a mask ROM according to claim 2, wherein said multi-value condition corresponds to at least a three-value condition.

* * * * *